US 7,265,022 B2

United States Patent
Ito et al.

(12) United States Patent
(10) Patent No.: US 7,265,022 B2
(45) Date of Patent: Sep. 4, 2007

(54) METHOD OF FABRICATING SEMICONDUCTOR DEVICE WITH STI STRUCTURE

(75) Inventors: Katsuya Ito, Mie (JP); Hiroaki Tsunoda, Mie (JP); Takanori Matsumoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 11/086,379

(22) Filed: Mar. 23, 2005

(65) Prior Publication Data
US 2005/0230780 A1    Oct. 20, 2005

(30) Foreign Application Priority Data
Mar. 23, 2004    (JP)    ............... 2004-085052

(51) Int. Cl.
*H01L 21/76*    (2006.01)
(52) U.S. Cl. .................. 438/424; 438/426; 438/443
(58) Field of Classification Search ............. 438/424, 438/426, 443–445, 427, 712
See application file for complete search history.

(56) References Cited

U.S. PATENT DOCUMENTS
6,531,402 B2 *    3/2003    Nakagawa ............ 438/710

FOREIGN PATENT DOCUMENTS
JP    2000-156402    6/2000

* cited by examiner

*Primary Examiner*—Theresa Doan
(74) *Attorney, Agent, or Firm*—Oblon, Spivak, McClelland, Maier & Neustadt, P.C.

(57) ABSTRACT

A method of fabricating a semiconductor device, includes depositing, on a semiconductor substrate, a gate insulating film, a polycrystalline or amorphous silicon film, a silicon nitride film and a silicon oxide film sequentially, patterning a resist for forming a plurality of trenches on an upper surface of the substrate so as to have opening widths differing from each other, etching the silicon oxide film and the silicon nitride film formed on the substrate by an reactive ion etching (RIE) process with the resist serving as a mask, and etching the polycrystalline or amorphous silicon film, the gate insulating film and the substrate by the RIE process with the etched silicon oxide film and silicon nitride film serving as a mask using reactive plasma including a halogen gas, fluorocarbon gas, Ar and O2, thereby simultaneously forming the trenches with opening widths differing from each other.

2 Claims, 3 Drawing Sheets

METHOD OF FABRICATING SEMICONDUCTOR DEVICE WITH STI STRUCTURE

CROSS-REFERENCE TO RELATED APPLICATION

This application claims the benefit of priority form Japanese patent application No. 2004-85052, filed Mar. 23, 2004, the content of which is incorporated herein by reference.

BACKGROUND OF THE INVENTION

1. Field of the Invention

The present invention relates to a semiconductor device with trenches having larger and smaller opening widths at a surface of a semiconductor substrate respectively and a method of fabricating the same.

2. Description of the Related Art

Non-volatile memories such as flash memories include a memory cell region in which a number of cell transistors are formed and a peripheral circuit region which is formed to drive the cell transistors and transistors of high breakdown voltage type are provided. The peripheral circuit region necessitates a longer insulation distance than the memory cell region since the transistors have higher breakdown voltages than the cell transistors. These elements are provided in an active region of the semiconductor substrate separated by a shallow trench isolation (STI) structure.

With recent refinement of design rules, a trench width of STI has been reduced such that an aspect ratio (a ratio between the width and the height of the trench) tends to become higher. It has technically been difficult to form STI with a high aspect ratio because of etching accuracy and the trench fill capability of an insulating film. In view of the aforementioned problem, a trench which is as shallow as possible is formed in the memory cell region so that the trench opening is narrowed since the cell transistors do not require high breakdown voltage, and regarding the transistors in the peripheral circuit region which require high breakdown voltage, the trench opening is widened since the trench needs to be rendered deeper for the purpose of securement of the breakdown voltage. As a result, the aspect ratio is prevented from being increased.

Accordingly, STI trenches of the memory cell and peripheral circuit regions need to have depths different from each other. In an actual trench forming step (hereinafter referred to as "a first conventional method"), an etching process is carried out in two steps. More specifically, a first silicon oxide film, a first polycrystalline silicon film, a silicon nitride film and a second silicon oxide film are sequentially deposited on a silicon substrate. Subsequently, a photoresist is formed by the photolithography process into a predetermined pattern. The second silicon oxide film and silicon nitride film are etched by a reactive ion etching (RIE) process with the photoresist serving as a mask. After the photoresist has been removed, the second polycrystalline silicon film, first silicon oxide film and silicon substrate are etched with the second silicon oxide film serving as a mask. In this case, a trench having a uniform depth is formed in the silicon substrate.

In order that a part of the trench at the peripheral circuit region side may be rendered deeper, a photoresist is patterned on a part corresponding to the memory cell region by the photolithography. The trench in the peripheral circuit region is etched with the photoresist serving as a mask until a predetermined depth is obtained, whereupon the trench has different depths in the peripheral circuit region and the memory cell region. Thus, since the depths of the trench differ in the memory cell and peripheral circuit regions, the STI width in the memory cell region can be reduced to a minimum according to the aspect ratio, whereas the depth according to the breakdown voltage can be ensured in the peripheral circuit region.

JP-A-2000-156402 discloses another method of forming a trench having different levels of the bottom (hereinafter referred to as "a second conventional method"). Trenches having a larger opening width and a smaller opening width respectively are formed in the semiconductor substrate. The trench with the larger opening width has a bottom including a central part higher than the other part of the bottom.

The second conventional method has an advantage that each of the photolithography and etching processes needs to be carried out only once. However, this method cannot provide a shallower trench with a smaller opening width and a deeper trench with a larger opening width. More specifically, one trench with the smaller opening width needs to be shallower and another trench with the larger opening width needs to be deeper. In the above-described fabricating method, the level of the central region of the trench with the larger opening width is increased while both trenches have the same depth. Thus, this method cannot be employed because a trench made by this method has a reverse condition.

The trenches of the memory cell and peripheral circuit regions cannot be formed simultaneously in the first conventional method. Each of the photolithography process and etching process needs to be carried out at least twice. As a result, since the number of fabrication steps in the forming of trenches cannot be reduced, the production yield cannot be improved and the production cost cannot be reduced.

BRIEF SUMMARY OF THE INVENTION

Therefore, an object of the present invention is to provide a semiconductor device in which a trench with a smaller opening width is formed so as to be shallower whereas another trench with a larger opening width is formed so as to be deeper and a method of fabricating the semiconductor device, in which method the trenches can be formed by a single time of photolithography process.

The present invention provides a method of fabricating a semiconductor device, comprising depositing, on a semiconductor substrate, a gate insulating film, a polycrystalline or amorphous silicon film, a silicon nitride film and a silicon oxide film sequentially, patterning a resist for forming a plurality of trenches on an upper surface of the substrate so as to have opening widths differing from each other, etching the silicon oxide film and the silicon nitride film formed on the substrate by an reactive ion etching (RIE) process with the resist serving as a mask, and etching the polyerystalline or amorphous silicon film, the gate insulating film and the substrate by the RIE process with the etched silicon oxide film and silicon nitride film serving as a mask using reactive plasma including a halogen gas, fluorocarbon gas, Ar and O2, thereby simultaneously forming the trenches with opening widths differing from each other.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
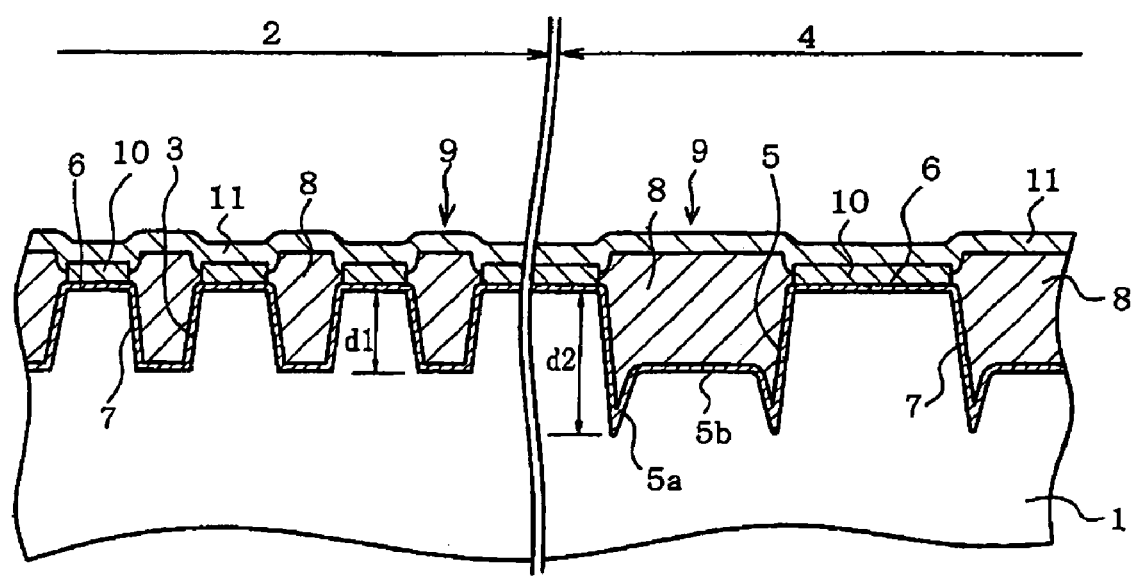
FIG. 1 is a typical sectional view of the semiconductor device of one embodiment in accordance with the present invention.

One embodiment of the present invention will be described with FIGS. 1 to 2E. The invention is applied to a flash memory in the embodiment. Referring to FIG. 1, an overall structure of the flash memory is shown. The device is formed with element isolation regions. The flash memory includes a silicon substrate 1 serving as a semiconductor substrate and having an upper surface. The substrate 1 includes a memory cell region 2 in which a trench 3 (a first element-isolating trench) is formed so as to be open at the upper surface of the substrate 1. The substrate 1 further includes a peripheral circuit region 4 in which another trench 5 (a second element-isolating trench) is formed so as to be open at the upper surface of the substrate 1. The trench 3 has a larger opening width than the trench 5, namely, the opening of the trench 3 is narrower than the opening of the trench 5. The trench 3 has a depth measured from the surface of the substrate 1, which depth is set to 100 nm (first depth d1). The trench 5 has a bottom including opposite ends 5a each of which has a depth of 170 nm (second depth d2) measured from the surface of the substrate 1 and a central portion 5b having a depth of 100 nm. In other words, each bottom end of the trench 5 has a larger depth than the trench 3 and the central bottom of the trench 5 has a smaller depth than each bottom end of the trench 5.

A silicon oxide film 6 serving as a gate insulating film is formed on the surface of a flat portion of the substrate 1 so as to have a film thickness of about 10 nm. A silicon oxide film 7 is formed on the surface of each of the trenches 3 and 5 so as to have a film thickness of about 6 nm. Each of the trenches 3 and 5 is filled with a silicon oxide film 8 serving as an insulating film, whereupon a shallow trench isolation structure 19 is formed. A polycrystalline silicon film 10 is deposited on the silicon oxide film 6. Another polycrystalline silicon film 11 is formed so as to cover entire polycrystalline silicon film 10 and silicon oxide film 8. The polycrystalline silicon film 11 has a film thickness of 100 nm.

According to the above-described structure, the trench 3 of the memory cell region 2 is set to a higher aspect ratio than the trench 5 of the peripheral circuit region 4. However, the trench 3 has the smaller depth d1 than the trench 5. Accordingly, since occurrence of void can be suppressed when the trench 3 is filled with the silicon oxide film 8, the trench fill capability can be improved. Furthermore, the trench 5 of the peripheral circuit region 4 has a lower aspect ratio than the trench 3. The depth d2 of each of the opposite bottom ends 5a of the trench 4 is larger than the depth d1 of the central bottom 5b. Consequently, since the length of the insulation distance is increased when the trench 5 is filled with the silicon oxide film 8, the breakdown voltage of an element to be formed can be increased.

Figure 2A:
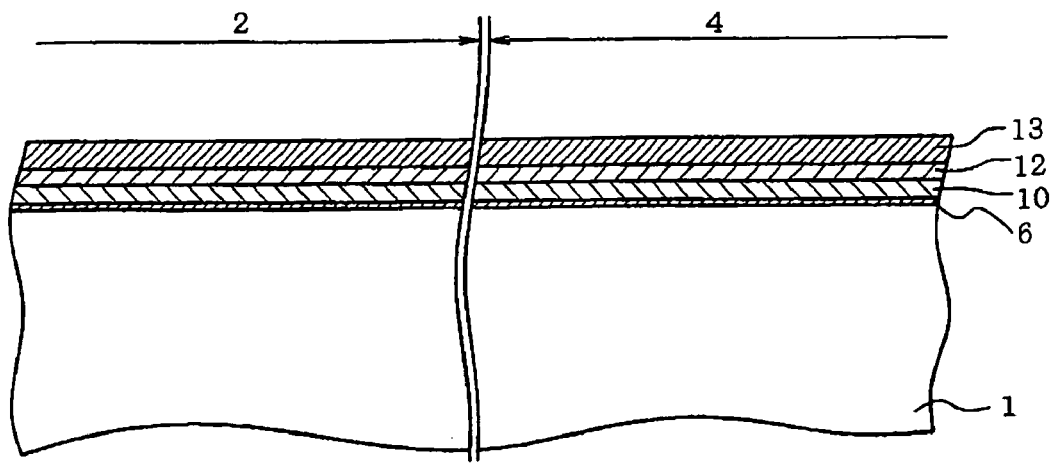
FIGS. 2A to 2E are typical sectional views of the semiconductor device at the steps of the fabricating process.
Figure 2B:
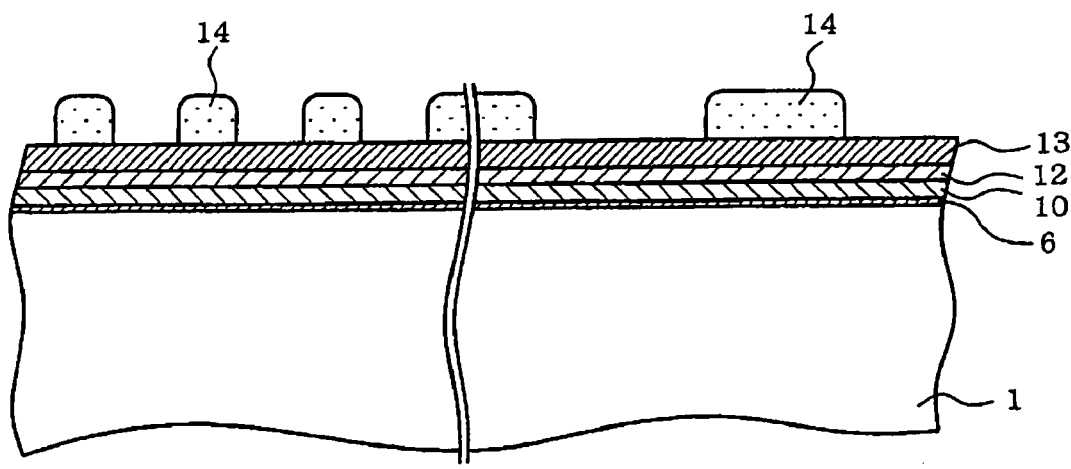
Figure 2C:
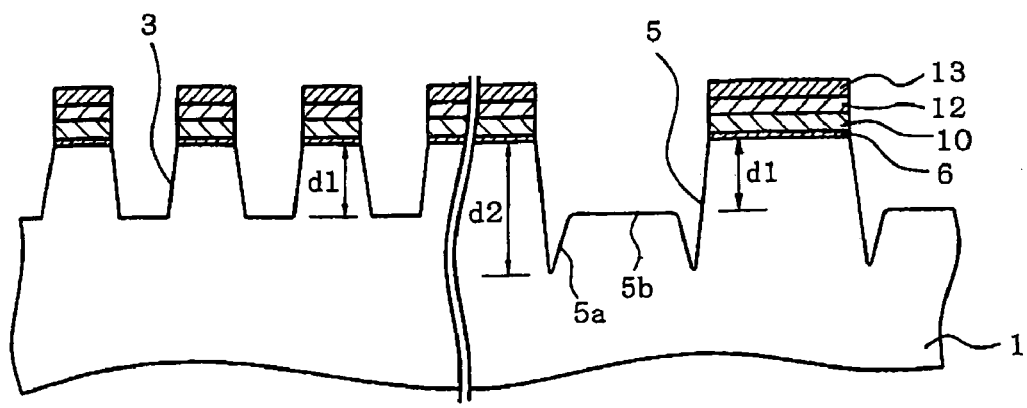
Figure 2D:
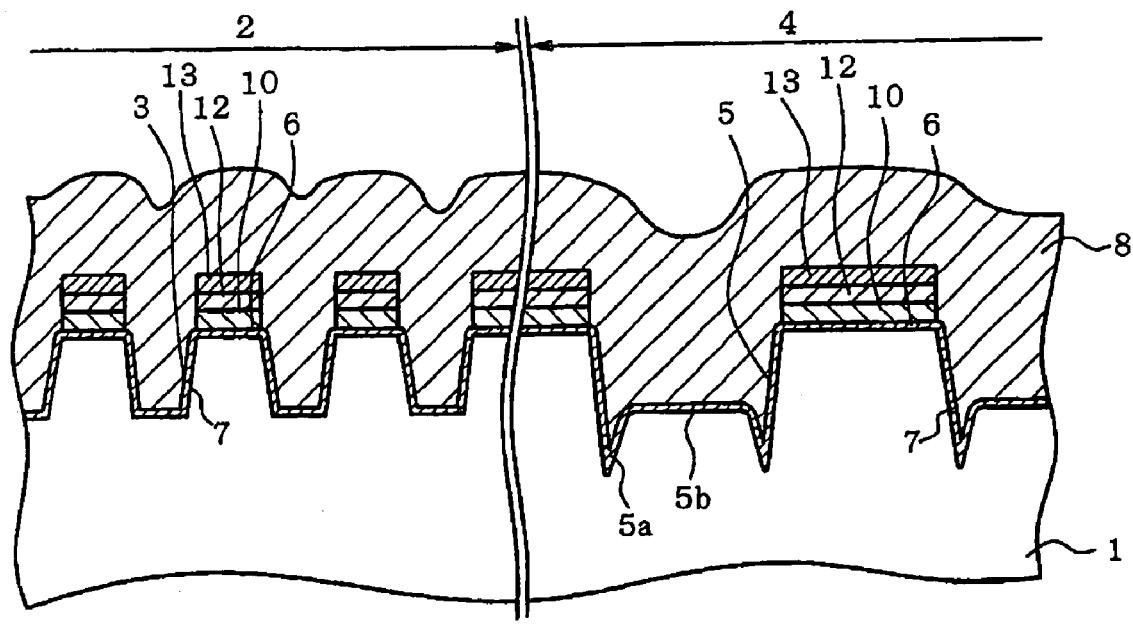
Figure 2E:
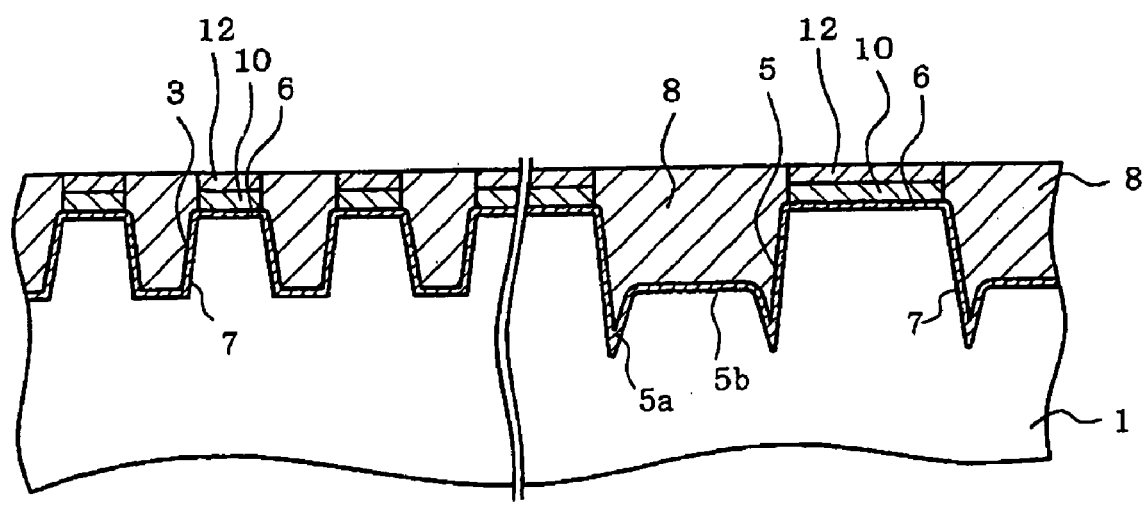

The fabrication process of the foregoing structure will now be described with reference to FIGS. 2A to 2E showing the steps of the fabrication process. Referring to FIG. 2A, firstly, on the substrate 1 are sequentially deposited the first silicon oxide film 6 with the film thickness of 10 nm, first polycrystalline silicon film 10 with the film thickness of 60 nm and silicon nitride film 12 and second silicon oxide film 13.

Subsequently, the photoresist 14 is formed into a predetermined pattern by the normal photolithography process, whereby a pattern for forming element isolation regions corresponding to the memory cell region 2 and peripheral circuit region 4 is formed. The second silicon oxide film 13 and silicon nitride film 12 are etched by the RIE process with the photoresist 14 serving as a mask.

The silicon substrate 1 is then subjected to $O_2$ plasma so that the photoresist 14 is removed. Thereafter, the silicon nitride film 12, polycrystalline silicon film 10, first silicon oxide film 6 and substrate 1 are etched continuously in the same chamber by the RIE process with the second silicon oxide film 13 serving as a mask, whereupon the trenches 3 and 5 are formed simultaneously as shown in FIG. 2C.

For example, a gas which is a mixture of HBr, $Cl_2$, $O_2$ and $CF_4$ is used as an etching gas in the case where the polycrystalline silicon film 10 is etched in the simultaneous forming of the trenches. A gas which is a mixture of Ar and $CHF_3$ is used as an etching gas in the case where the silicon oxide film 6 is etched. Furthermore, as an etching gas for the silicon substrate 1, HBr or $Cl_2$ is used as a halogen gas and $CHF_3$ is used as a fluorocarbon gas. Alternatively, a mixture of $O_2$ with each gas is used.

HCl, $NF_3$, $SF_6$ or the like may be used as the etching gas for the polycrystalline silicon film 10, instead of HBr or $Cl_2$. Further, a mixture of any one of $CF_4$, $CH_2F_2$, $CH_3F$, $C_4F_8$, $C_5F_8$ and $C_4F_6$ with CO and Xe may be used as the etching gas for the silicon oxide film 6, instead of $CHF_3$. Additionally, $CF_4$, $CH_2F_2$, $CH_3F$, $C_4F_8$, $C_5F_8$, $C_4F_6$ or the like may be used as the etching gas for the substrate 1, instead of $CHF_3$.

A luminescence property of plasma is detected. At the time the luminescence property changes, the fabrication process proceeds from the etching of the polycrystalline silicon film 10 to the etching of the silicon oxide film 6 and further from the etching of the silicon oxide film 6 to the substrate 1. A time-dependent control is executed for the etching of the substrate 1.

The trenches 3 and 5 are simultaneously formed in the substrate 1 by the etching process. The trench 5 has a larger opening width than the trench 3. The trench 5 has a bottom including opposite ends 5a and a central portion 5b. Each end 5a has a depth d2 which is larger than a depth d1 of the central portion 5b. Thereafter, the substrate 1 is heat-treated at 1000° C. in an atmosphere of $O_2$ so that a third silicon oxide film 7 with a film thickness of 6 nm is formed.

Subsequently, a fourth silicon oxide film 8 is deposited by a high density plasma (HDP) process so as to fill the trenches 3 and 5 as shown in FIG. 2D. The fourth silicon film 8 is then planarized by a chemical mechanical polish (CMP) process and heat-treated at 900° C. in an atmosphere of nitride, as shown in FIG. 2E. The fourth silicon film 8 is further immersed in a solution of $NH_4F$ and thereafter, the silicon nitride film 12 is removed by phosphating at 150° C. A second polycrystalline silicon film 11 added with phosphor is deposited by low pressure CVD so as to have a film thickness of 100 nm, whereby the structure as shown in FIG. 1 is obtained. Thereafter, steps of forming a gate insulating film, control gate electrodes and wiring pattern are sequentially executed such that a wafer process ends.

When the foregoing forming process is adopted, the trenches 3 and 5 having different depths are formed in the substrate 1 by one time of execution of the lithography process and RIE etching process. In this case, the trench 3 has a substantially flat bottom and the depth d1. The trench 5 has the depth d2 (deeper than depth d1) at the opposite ends of bottom thereof and the depth d1 at the central bottom thereof.

In the embodiment, the depth d1 of the trench 3 is set to 100 nm and the depth d2 of each bottom end of the trench 5 is set to 175 nm. Since the difference between depths d1 and d2 is controlled by adjusting a mixing ratio of an etching gas, an etching condition can be selected according to an aspect ratio of the trench to be formed, the opening width, the trench depth and the like, whereupon a suitable condition can be selected.

According to the foregoing embodiment, the trench 5 in the peripheral circuit region 4 is deeper at each bottom end (depth d2 than the trench 3 in the memory cell region 2 (depth d1) and has the central bottom as deep as the trench 3. These trenches 3 and 5 are simultaneously formed. Accordingly, the structure satisfying the characteristics of elements can be formed by one time of execution of the forming process. Consequently, the number of fabrication steps can be reduced and accordingly, the production cost can be reduced and the yield cam be improved.

Furthermore, since the trenches are formed by one time of photolithography process for patterning the photoresist 14, a conventionally required patterning for trenches with different depths is not required. As a result, a boundary between regions has no stepped portion. Consequently, a dummy region which has no adverse effect on element characteristics need not be provided even when a stepped portion is produced in the regional boundary. As a result, an element area can be reduced.

The invention should not be limited by the foregoing embodiment but may be modified or expanded as follows. In the foregoing embodiment, the depth d1 of the trench 3 is equal to the depth d1 of the central bottom of the trench 5. However, the depth d1 of the trench 3 may be substantially equal to the depth d1 of the central bottom of the trench 5 within the etching conditions and variations.

Furthermore, the central bottom 5b may be deeper or shallower than the trench 3 on condition that the trench 5 can be formed so that each bottom end 5a thereof has the depth d2 ensuring breakdown voltage.

Amorphous silicon films may be used instead of the polycrystalline silicon films 10 and 11 used in the foregoing embodiment.

In the foregoing embodiment, the photoresist 14 is removed after processing of the mask material and thereafter, the polycrystalline silicon film 12, first silicon oxide film 6 and substrate 1 are etched. However, the polycrystalline silicon film 12, first silicon oxide film 6 and substrate 1 may be etched with the photoresist 14 remaining.

The invention may be applied to semiconductor devices formed with trenches with different depths other than the flash memories.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:
   depositing, on a semiconductor substrate, a gate insulating film, a polycrystalline or amorphous silicon film, a silicon nitride film and a silicon oxide film sequentially;
   patterning a resist for forming a plurality of trenches on an upper surface of the substrate so as to have opening widths differing from each other;
   etching the silicon oxide film and the silicon nitride film formed on the substrate by an reactive ion etching (RIE) process with the resist serving as a mask; and
   etching the polycrystalline or amorphous silicon film, the gate insulating film and the substrate by the RIE process with the etched silicon oxide film and silicon nitride film serving as a mask using reactive plasma including a halogen gas, fluorocarbon gas, Ar and O2, thereby simultaneously forming the trenches with opening widths differing from each other.

2. The method according to claim 1, wherein an etching gas is used for etching the substrate in the step of forming the trenches, and the etching gas includes HBr and $C_{12}$ serving as a halogen gas and $CHF_3$ serving as a fluorocarbon gas.

* * * * *